United States Patent [19]

Effenberger et al.

[11] Patent Number: 5,238,748

[45] Date of Patent: *Aug. 24, 1993

[54] POLYIMIDE AND FLUOROPOLYMER CONTAINING FILMS AND LAMINATES

[75] Inventors: John A. Effenberger, Bedford; Keith G. Koerber, Goffstown; E. C. Lupton, Jr., Bedford, all of N.H.

[73] Assignee: Chemfab Corporation, Merrimack, N.H.

[*] Notice: The portion of the term of this patent subsequent to Apr. 21, 2009, has been disclaimed.

[21] Appl. No.: 830,002

[22] Filed: Jan. 31, 1992

Related U.S. Application Data

[63] Continuation of Ser. No. 717,855, Jun. 19, 1991, Pat. No. 5,106,673, which is a continuation of Ser. No. 314,547, Feb. 23, 1989, abandoned.

[51] Int. Cl.$^5$ .............................................. B32B 27/06
[52] U.S. Cl. ................................... 428/421; 428/422; 428/458; 428/463; 428/473.5
[58] Field of Search ............... 428/421, 413, 216, 220, 428/336, 337, 422, 473.5, 349, 383, 377, 458, 463; 524/405

[56] References Cited

U.S. PATENT DOCUMENTS

| | | | |
|---|---|---|---|
| 3,455,774 | 7/1969 | Lindsey et al. | 428/422 |
| 3,616,177 | 10/1971 | Gumerman | 428/216 |
| 3,642,569 | 2/1972 | Gerow | 428/473.5 |
| 4,098,756 | 7/1978 | Miller et al. | 428/413 X |
| 4,335,238 | 6/1982 | Moore et al. | 428/421 X |
| 4,628,003 | 12/1986 | Katz | 428/421 X |
| 4,770,927 | 9/1988 | Effenberger et al. | 428/422 X |
| 4,883,716 | 11/1989 | Effenberger et al. | 428/421 |
| 4,957,961 | 9/1990 | Chandrasekaran et al. | 524/405 |
| 5,106,673 | 4/1992 | Effenberger et al. | 428/216 |

Primary Examiner—Thomas J. Herbert, Jr.
Attorney, Agent, or Firm—White & Case

[57] ABSTRACT

A multi-layer film of improved adhesive strength and other properties is made by combining a layer of polyimide and one or more layers of fluoropolymer selected from the group consisting of PTFE, thermally compatible TFE copolymers, blends thereof, PVF$_2$, thermally compatible VF$_2$ copolymers, blends thereof, PCTFE, thermally compatible CTFE copolymers, and blends thereof. It has been found that the peel adhesion between the polyimide layer and any fluoropolymer layer is greatly improved over known products. Laminated composites of improved adhesion and cohesion are made using such a multi-layer film and at least one floropolymer film. The fluoropolymer film is thermally weldable to the polyimide film.

18 Claims, No Drawings

POLYIMIDE AND FLUOROPOLYMER CONTAINING FILMS AND LAMINATES

This application is a continuation of application Ser. No. 07/717,855, filed on Jun. 19, 1991 now U.S. Pat. No. 5,106,673, which is a continuation of application Ser. No. 07/314,547, Feb. 23, 1989, abandoned.

The present invention relates to novel polyimide and fluoropolymer containing films characterized by very high adhesion between the polyimide and fluoropolymer. Such films are useful, for example, in making electrical insulation tapes for avionic systems. Additionally, this invention relates to the combination of such films for use in the preparation of laminated composites of improved adhesion and cohesion as insulation for wire and cable constructions which have outstanding chemical, thermal, physical and mechanical properties, particularly improved resistance to arc tracking and cut-through.

BACKGROUND OF THE INVENTION

High temperature wire and cable insulation, in particular insulation for aerospace wire and cable, requires a cut-through and abrasion, fire retardance, low smoke generation, safety in use, ease of stripping and termination, and resistance to chemicals and solvents. High temperature wire and cable insulation based on fluoropolymers, such as PTFE and copolymers of TFE with hexafluoropropylene, such as Teflon ® FEP, or with perfluorovinyl ethers, such as Teflon ® PFA, are well known in the art. While such insulation has excellent chemical resistance to fluids with which it may come into contact, such as "Skydrol ®," and possesses outstanding dielectric and weathering properties as well, its mechanical properties are such that it frequently offers little resistance to scrape abrasion and exhibits less than desirable resistance associated with its use in avionic systems which specify operation at 180° C. and can encounter excursions to 200° C.

In order to address this mechanical deficiency at elevated temperatures, insulating composites have been devised which incorporate polyimide resins as well as fluoropolymers. Such insulation is frequently based on polyimide films such as Kapton ®, which are initially coated or laminated with TFE copolymers such as FEP or PFA, e.g., Kapton ® F. These films are then slit into tapes which are self-adhering while they are wrapped on to conductors at elevated temperature. These wrapped tapes may then be taped over or extruded over with fluoropolymers to provide a wire insulation whose exterior exhibits the good chemical resistance, weatherability, and dielectric behavior of the fluoropolymer, and whose polyimide interior provides the mechanical toughness to offer good scrape abrasion and cut-through resistance at elevated temperatures.

While constructions containing polyimide are thought to have a very desirable balance of properties since the polyimide has very good high temperature properties, excellent fire retardance and very good electrals, it has been determined that under some conditions polyimide-containing constructions can arc track, resulting in the formation of a carbonaceous char. The resulting conductive path can rapidly propagate when seemingly small voltages are applied. Arc tracking is a catastrophic failure in the presence of an electrical arc when a short circuit occurs between the conductor and a conducting medium external to the insulation such as a moderately conductive fluid. Such a failure may be occasioned by relatively slight mechanical damage to the insulation which becomes rapidly enlarged at the elevated temperature of the electrical arc.

Fluoropolymers and fluoropolymer-containing materials have excellent electrical properties, including a very low tendency to arc track. However, fluoropolymers are generally soft and prone to cut-through and creep particularly at the elevated temperatures where the use of insulated constructions in avionics is desired.

Many such hybrid constructions of polyimides and fluoropolymers contain layers of TFE copolymers exclusively. However, the presence of a fluoropolymeric layer in the taping elements which is exclusively a TFE copolymer, such as FEP or PFA, results in a tape wrapping element which can be susceptible to delamination at elevated temperatures when only modest adhesion between the polyimide and fluoropolymer is achieved as in the current state of the art. A further short-coming of known polyimide insulation based on tapes employing bonding layers which contain exclusively TFE copolymers is that such insulation does not consistently exhibit good resistance to arc tracking.

The bond between the polyimide and FEP or PFA directly applied to the polyimide in present films such as Kapton ® F is not as fully developed as it could be, being typically about 4 lb/inch at room temperature. Since these copolymers begin to soften and flow even below their melting point, the failure mechanism at the interface for these known films is adhesive and peeling can be initiated at relatively low temperatures compared to their melting temperatures.

Other polyimide/fluoropolymer based tapes such as DF2929 or DF2919 have been commercially available from Chemical Fabrics Corporation. While these tapes contain PTFE homopolymer and a topcoat of PTFE copolymer, such as FEP or PFA, over the polyimide, they do not exhibit the very high adhesion developed between the polyimide and fluoropolymer as do the invention films.

U.S. Pat. No. 3,616,177 describes an asymmetric laminar structure comprising polyimide coated on one or both sides with an FEP copolymer and further coated on one side with a PTFE polymer. However, such a structure is prone to delamination at high temperatures due to the use of a TFE copolymer (FEP) directly on the polyimide layer with only modest adhesion.

U.S. Pat. No. 4,628,003 discloses a heat sealable, high temperature insulative wrapping. The wrapping is a film comprised of a polyimide coated with two fluoropolymer layers. Various fluoropolymers, such as hexafluoropropylene/tetrafluoroethylene copolymers and perfluoroalkyvinylether and perfluoropropylvinylether copolymers with tetrafluoroethylene, are useful in the fluoropolymer layers. Each fluoropolymer layer also contains a pigment to provide coloration and act as an infrared absorber, and also results in increased retention of heat seal bond strengths after heat aging. The polyimide film may also be treated with a silane to improve adhesion of the fluoropolymer layers. These laminate compositions, however, do not entirely avoid the serious problems occasioned by modest interfacial adhesion, particularly at the polyimide/fluoropolymer interface.

Accordingly, it is an object of the present invention to provide improved polyimide and fluoropolymer films for making insulation tape with excellent adhesive and cohesive properties at high temperatures as a means of improving cut through resistance.

It is also an object of the present invention to reduce or eliminate the tendency of known laminations made using polyimide and fluoropolymer tapes to arc track by maximizing the PTFE content of the total fluoropolymer present.

It is a further object of the present invention to provide an improved laminated composite as insulation for wire and cable with excellent properties, as well as a method of making such a laminated composite and related wire and cable constructions.

SUMMARY OF THE INVENTION

These and other objects are accomplished by employing the novel multi-layer films and laminates of the present invention. A multi-layer film of improved adhesive strength and other properties is made by combining a layer of polyimide and one or more layers of fluoropolymer selected from a group consisting of PTFE, thermally compatible TFE copolymers and any combination or blend thereof. It has been found that the peel adhesion between the polyimide layer and any fluoropolymer layer is greatly improved over known products and is at least nine pounds per inch. Laminated composites of improved adhesion and cohesion made using such a multi-layer film and at least one fluoropolymer film are equally satisfactory. It should be understood that the fluoropolymer film or films should be thermally weldable to the polyimide-containing film, which fluoropolymer film comprises fluoropolymer selected from the group consisting of PTFE, thermally compatible TFE copolymers, and any combination or blend thereof.

Insulation tape for wire and cable made using these films and laminated composites are particularly useful in aerospace applications since they do not suffer the drawbacks of similar prior art composites.

The present invention also relates to a method of preparing a multi-layer composite, which comprises preparing at least one polyimide-containing film; coating the polyimide-containing film with an adhesive layer comprising a material selected from the group consisting of PTFE, thermally compatible TFE copolymers, and blends thereof; coating the adhesive layer on at least one surface of the polyimide-containing film with a fluoropolymer film; applying a second fluoropolymer film to the adhesive layer on at least one surface of the polyimide-containing layer; and thermally welding the layers to form a composite.

The claimed invention provides insulating tapes devised from fluoropolymer clad polyimides and multi-layer polymer films in which a material selected from the group consisting of PTFE, a TFE copolymer and blends thereof may be employed as adhesives at both polymide/fluoropolymer and fluoropolymer/fluoropolymer interfaces of the taping layers. Such constructions provide the advantages of maximizing the PTFE content of the insulating system to provide the best electrical performance while optimizing the balance between thermal processability and cohesive structural integrity.

It has been found that even TFE copolymers when used alone at the polyimide/fluoropolymer interface, can be made resistance to delamination from the polyimide at elevated temperatures, as can blends of TFE copolymers with PTFE homopolymer and even PTFE alone, resulting in adhesion to the polyimide which is about three times stronger than that of the state of the art TFE copolymer clad polyimides at room temperature. Blends of TFE copolymers with PTFE used as cladding and cladding components exhibit a high temperature failure mechanism which is cohesive rather than adhesive even at temperatures above that of the melting point of the copolymer and approaching that of the homopolymer itself. This is unexpected, since the prior art emphasizes the desirability of employing only TFE copolymers such as FEP or PFA to achieve this bond. It has been found that a wire insulated with fluoropolymer and fluoropolymer clad polyimide tapes is significantly more resistant to arc tracking when the total fluoropolymer content is based more upon PTFE than its copolymers. In this regard, incorporation of PTFE into the adhesive layers containing copolymer provides the additional benefit of improving arc track resistance as well as adhesion since the adhesion layers in any given taping element may be kept relatively thin (<0.2 mils) permitting use of PTFE.

While PTFE may be employed alone as the adhesive layer material, it is more desirable from a processing point of view to utilize a combination of PTFE and a thermally compatible TFE copolymer to create this bond, since the use of PTFE alone necessitates processing temperatures and times that may lead to degradation of the strength of the polyimide or polyimide/fluoropolymer interface. Thermally compatible TFE copolymers must be used according to the claimed invention, meaning these copolymers must be co-processable with PTFE so as to provide a fused blend of the polymers with good physical properties. Such processing methods are described in applicant's U.S. application Ser. No. 226,614 filed Aug. 1, 1988, now U.S. Pat. No. 4,883,716 and U.S. application Ser. No. 305,748 filed Feb. 2, 1989, now abandoned, which are incorporated herein by reference.

DETAILED DESCRIPTION OF THE INVENTION

According to the claimed invention a multi-layer film is provided comprising at least one polyimide-containing central layer and at least one fluoropolymer layer which may be adhered to each other by an adhesive of PTFE, thermally compatible TFE copolymers, or blends thereof.

Preferably, the thermally compatible TFE copolymer is selected from the group consisting of FEP and PFA. By utilizing a blend of PTFE and FEP or PFA as an adhesive between the composite layers, subsequent co-wrapping of the tapes to create a wire insulation system is facilitated and results in a very high degree of cohesion at all interfaces. Moreover, since the copolymer is present in each of the mating faces of the tapes to be bonded, little mass transport is actually required in the melt to achieve the bond. Thus, it requires minimum time and temperature to affect the desired result.

The wire insulation constructions of the invention are richer in PTFE than those presently in use, since the bonding layers between the polyimide and fluoropolymer films, and between the various fluoropolymer layers employed in the system can contain both PTFE and TFE copolymers. Such a construction is more resistant to catastrophic failure in the presence of an electrical arc than systems which are richer in polyimide and which employ less well bonded copolymers alone in such bonding layers.

For these reasons, it is preferable to maximize the PTFE content in such composites. One or more of the fluoropolymer layers may be formed from PTFE. If PTFE is used in a bonding layer such that it is an infused condition in a tape ready for wrapping on a wire, the thickness of such a layer should be about 0.2–0.4 mil. In addition, the thickness of the adhesives layers, if they contain TFE copolymer, should be minimized.

While the details of the fluoropolymer behavior in the presence of an intense, high temperature electrical arc are not completely understood, improved arc tracking of the claimed composites may well involve the well-known ablative behavior of PTFE at elevated temperatures. For that reason, it may also be beneficial to incorporate additives into the fluoropolymer layers used to create an insulation system which are also ablative in nature.

Such additives include minerals which outgas at the temperature of the arc, such as carbonates which evolve carbon dioxide, e.g., calcium or magnesium carbonate, or minerals containing water or hydration. Other suitable additives would include polymers which, like PTFE itself, decompose without producing carbonaceous or other conductive by-products on decomposition. These additives may be incorporated into the fluoropolymer layers of the claimed composite preferably in those layers nearest the conductor to be insulated.

In order to avoid bonding of any fluoropolymer layers of the claimed composite to the conductor itself during tape wrapping, it is desirable that the face of the interior layer adjacent to the conductor contain PTFE alone, while its opposite face contains an adhesive comprising PTFE, a thermally compatible TFE copolymer, or a blend thereof to promote thermal welding to itself and other layers in the construction.

At least one pigment may be incorporated into any of the fluoropolymer layers, films or adhesives of the claimed composite for purposes of laser marking. Such pigment may comprise 3–15% by weight of a fluoropolymer film or layer, preferably 4–10% by weight and most preferably 4–8% by weight. For example, an exterior fluoropolymer layer of PTFE may be used which incorporates one pigment. Alternatively, two layers may be used for this purpose, each incorporating different pigments of contrasting colors. Laser etching of the outermost pigmented layer would then reveal the contrasting color for identification of the wire type. The outermost pigmented layer should not be thicker than about 0.25 mil in order to obtain sharp definition of the identifying code at the energy density of lasers presently commercially available.

Suitable material for use in the polyimide-containing film of the claimed composite is set forth in U.S. Pat. No. 3,616,177, the disclosure of which is incorporated herein by reference. Kapton ® H, Kapton ® HN, or Kapton ® F may be used in the polyimide layer, as well as other polyimide films such as Apical ® or Upilex ®. The polyimide film layer should have a thickness of about 0.5–2.0 mil, preferably 0.7–1.0 mil.

PTFE for use in the claimed invention should have a high molecular weight with a melt viscosity of at least $10^{10}$ poise, preferably $10^{10}$–$10^{12}$ poise, at 380° C. PTFE for use in the claimed invention may be derived from aqueous dispersion of such materials as Teflon ® 30, AD ® 1, and Algoflon ® 60.

Such PTFE is combined with a thermally compatible TFE copolymer, preferably FEP and PFA, to form the adhesive layers of the composite. If FEP is used, it should have a melting point of 268° C. and a melt viscosity of $3 \times 10^4$–$2.5 \times 10^5$ poise at 372° C. FEP may be derived from aqueous dispersion of such materials as Teflon ® 120, Teflon ® TE 9503, and Teflon ® TE 5582.

If PFA is used in the adhesive layers of the claimed invention, it should have a melting point of 305° C. and a melt viscosity of $3 \times 10^4$–$2.5 \times 10^5$ poise at 372° C. PFA may be derived from aqueous dispersion of a material such as Teflon ® 322 J. The adhesive layers may be applied by either coating or lamination techniques. Preferably they are formed by aqueous dispersion coating.

The adhesive layers should contain at least 40% by volume PTFE, with the remainder being a TFE copolymer with which it is thermally compatible. The most preferred composition for the adhesive layers is 50% by volume PTFE and 50% by volume thermally compatible TFE copolymer.

The claimed composite material may be used to prepare a large variety of insulative wraps. The thickness of individual layers, overall weight of the insulation, and the degree of overlap among layers may all be varied to provide a desired insulation product with any given wall thickness. For example, two central polyimide layers may be layered on one surface with double PTFE layers, with adhesive layers as described above sandwiched in between. Further PTFE layers may be applied to another surface of the polyimide layer, also with adhesive layers sandwiched in between. This forms a central polyimide-containing layer, an exterior PTFE-containing layer and an interior PTFE-containing layer. Pigmentation may be incorporated in the outermost PTFE layer while ablatives may be incorporated in the PTFE layers nearest the conduction. The adhesive layers of the claimed invention provide superior bonding of the entire wrap.

The following non-limiting examples are designed to further illustrate the claimed invention.

EXAMPLE 1

A 2 mil polyimide film of Kapton ® HN was initially coated with an aqueous dispersion blend of PTFE and PFA derived from Teflon ® 30B and Teflon ® 322J, respectively, such that a 0.05 mil resin coating was obtained containing 50% by weight PTFE and 50% by weight PFA on each face of the polyimide film. This film was subsequently coated with Teflon ® 30B dispersion to build an overcoat to the alloyed copolymer layer of 0.5 mils of PTFE. Lastly, a topcoat of the same PTFE/PFA alloy was applied using the same codispersion employed in the initial coat. These coatings were applied in a conventional dip coating tower with an evaporation/baking zone of seven feet in length and a fusing zone of seven feet in length at a line speed of 3–4 feet per minute. The web temperature in the fusing zone was about 680° F.

This multi-layer, fluoropolymer-clad polyimide film exhibited a room temperature, 180° peel adhesion strength of about 4 lb/inch, comparable to that specified for other fluoropolymer clad polyimides such as Kapton ® F.

This film was subsequently given additional thermal treatment by running it through a convectively heated oven with an eight foot long drying zone and an eight foot long baking/fusing zone. An additional source of thermal energy contained within the baking/fusing zone of the convective oven was a four foot long radiant electrical radiant heater with a maximum watt density of 22 watts per square inch.

The linear rate of travel of the film through the oven was set five feet per minute and the temperature of the convectively heated fusing zone was 750° F. Importantly, the radiant heater was energized to provide a 1000° F. emitter temperature. Residence time for the film exposed to this radiant emitter was about 45 seconds.

After this thermal treatment, the peel adhesion at room temperature rose dramatically to over 9 lb/inch, well above that of any commercially available fluoropolymer clad polyimide film which by the same method of measurement is typically 3-5 lb/inch.

Of equal importance, it was found that when this type of film was sealed to itself at 670° F. under moderate pressure, examination of the tendency of the bond to creep under constant load in a 180° peel mode and at elevated temperature (350° C.) was dramatically reduced relative to that of fluoropolymer clad films based upon TFE copolymer alone. At 350° C. (above the melting point of both the PTFE and PFA) and under a 0.5 lb/inch load, the peel rate was only 1/16-$\frac{1}{8}$ inches per minute. This low rate of high temperature creep of this fluoropolymer cladding is believed to translate to superior high temperature cut-through resistance and is indicative of the virtue of incorporating PTFE into the adhesive layer.

Additionally, microscopic examination of the peeled surface showed that adhesive failure of the fluoropolymer to polyimide had not occurred. Rather cohesive failure within the alloyed adhesive of PTFE layer itself had occurred demonstrating the great thermal stability of the adhesive bond between the polyimide and fluoropolymer in the invention film. The observed failure mechanism for fluoropolymer clad polyimides based upon TFE copolymers alone such as FEP and which do not exhibit high room temperature adhesion is adhesive and can be initiated well below the fluoropolymer melting point.

Film of this invention type by virtue of their well developed adhesion, in combination with fluoropolymer films with similar adhesive layers, have been found to be outstanding as tape-wrapped wire insulation. Higher cut-through resistance and excellent arc track behavior have been observed.

EXAMPLE 2

A 1.0 mil film of Kapton ® HN was coated with the same alloyed PTFE/PFA dispersion in described in Example 1 to provide a thin fluoropolymer adhesive layer.

Absent the radiant heat history (1000° F. emitter) described in Example 1, the peel strength of this fluoropolymer clad polyimide film to a 3 mil cast PTFE film containing a 0.1 mil layer of PFA on each surface was only 1.0 lb/inch.

After the same thermal radiant treatment of the coated polyimide, as described in Example 1, the peel strength rose to 12.5 lb/inch indicating the ability of such a well-bonded, alloyed PTFE/PFA adhesive to form a very strong, cohesive bond to a fluoropolymer film with a TFE copolymer surface.

It has also been observed that somewhat high emitter temperatures (1040° F.) are more effective for creating strong adhesive bonds of PTFE alloys to TFE copolymers or PTFE/TFE copolymer alloys.

Additionally, slightly higher emitter temperatures (less than 1080° F.) are effective in promoting strong adhesion of PTFE itself to a polyimide. While operable, these emitter temperatures are high enough to begin degrade the polymide itself but may be accommodated by varying line speed.

We claim:

1. A multilayer composite comprising at least one polyimide-containing film; and one or more fluoropolymer adhesive layers comprising material selected from the group consisting of PTFE, thermally compatible TFE copolymers, and blends thereof where one or more of the fluoropolymer layers comprises an ablative additive selected from the group consisting of carbonates that evolve carbon dioxide, minerals containing water of hydration, and polymers that decompose without producing carbonaceous or other conductive by-products on decomposition.

2. The composite according to claim 1 wherein the ablative additive comprises calcium or magnesium carbonate.

3. The composite according to claim 1 wherein the ablative additive comprises a mineral containing water of hydration.

4. The composite according to claim 1 wherein the ablative additive comprises a carbonate other than calcium or magnesium carbonate.

5. The composite according to claim 1 wherein one or more of the fluoropolymer layers comprises PTFE.

6. The composite according to claim 5 wherein the ablative additive comprises calcium or magnesium carbonate.

7. The composite according to claim 5 wherein the ablative additive comprises a mineral containing water of hydration.

8. The composite according to claim 5 wherein the ablative additive comprises a carbonate other than calcium or magnesium carbonate.

9. A wire insulated with one or more tapes comprising the films according to any one of claims 1-8.

10. A fluoropolymer film which has one or more layers comprising material selected from the group consisting of PTFE, thermally compatible TFE copolymers, and blends thereof where one or more of the fluoropolymer layers comprises an ablative additive selected from the group consisting of carbonates that evolve carbon dioxide, minerals containing water of hydration, and polymers that decompose without producing carbonaceous or other conductive by-products on decomposition which is subsequently bonded to at least one polyimide containing film to form a composite.

11. The film according to claim 10 wherein the ablative additive comprises calcium or magnesium carbonate.

12. The film according to claim 10 wherein the ablative additive comprises a mineral containing water of hydration.

13. The film according to claim 10 wherein the ablative additive comprises a carbonate other than calcium or magnesium carbonate.

14. The film according to claim 10 wherein one or more of the fluoropolymer layers comprises PTFE.

15. The film according to claim 10 wherein the ablative additive comprises calcium or magnesium carbonate.

16. The film according to claim 14 wherein the ablative additive comprises a mineral containing water of hydration.

17. The film according to claim 14 wherein the ablative additive comprises a carbonate other than calcium or magnesium carbonate.

18. A wire insulated with one or more tapes comprising the films according to any one of claims 10-17.

* * * * *

UNITED STATES PATENT AND TRADEMARK OFFICE
CERTIFICATE OF CORRECTION

PATENT NO. : 5,238,748
DATED : August 24, 1993
INVENTOR(S) : Effenberger et al.

It is certified that error appears in the above-indentified patent and that said Letters Patent is hereby corrected as shown below:

col. 1, line 24, after "a" insert --combination of excellent electrical properties, resistance to--;

col. 1, line 38, after "resistance" insert --to cut-through, particularly at the elevated temperatures--;

col. 3, line 65, "resistance" should read --resistant--;

col. 4, line 18, "adhesion" (second occurrence) should read --adhesive--;

col. 4, line 20, after "permitting" insert --maximal--;

col. 5, lines 4-5, delete "an infused" insert --in an unfused--;

col. 5, line 21, "or" should read --of--;

col. 7, line 39, "Film" should read --Films--;

col. 7, line 68, after "begin" insert --to--;

UNITED STATES PATENT AND TRADEMARK OFFICE
CERTIFICATE OF CORRECTION

PATENT NO. : 5,238,748

DATED : August 24, 1993

INVENTOR(S) : Effenberger et al.

It is certified that error appears in the above-indentified patent and that said Letters Patent is hereby corrected as shown below:

```
col. 8, line 57, "10" should read --14--.
```

Signed and Sealed this

Second Day of August, 1994

Attest:

BRUCE LEHMAN

Attesting Officer

Commissioner of Patents and Trademarks